US 6,737,896 B2

(12) United States Patent
Yoshioka

(10) Patent No.: US 6,737,896 B2
(45) Date of Patent: May 18, 2004

(54) SYNCHRONOUS CIRCUIT

(75) Inventor: Shinichi Yoshioka, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/395,057

(22) Filed: Mar. 25, 2003

(65) Prior Publication Data

US 2003/0218483 A1 Nov. 27, 2003

(30) Foreign Application Priority Data

Mar. 26, 2002 (JP) ........................................ 2002-085117

(51) Int. Cl.[7] ................................................ H03L 7/00
(52) U.S. Cl. ...................... 327/144; 327/146; 327/150; 375/362
(58) Field of Search ................................ 327/144, 145, 327/146, 147, 150; 331/34, 45; 375/362, 365, 375, 376

(56) References Cited

U.S. PATENT DOCUMENTS

| 4,755,704 A | * | 7/1988 | Flora et al. ................. 327/152 |
| 5,574,756 A | * | 11/1996 | Jeong ........................ 375/376 |
| 5,886,552 A | | 3/1999 | Chai et al. .................. 327/165 |
| 6,008,663 A | * | 12/1999 | Takabe ....................... 324/765 |

FOREIGN PATENT DOCUMENTS

JP          2001-186111          7/2001

* cited by examiner

*Primary Examiner*—Timothy P. Callahan
*Assistant Examiner*—An T. Luu
(74) *Attorney, Agent, or Firm*—Oblon, Spivak, McClelland, Maier & Neustadt, P.C.

(57) ABSTRACT

A synchronous circuit according to an embodiment of the present invention, comprising:
   a clock selector configured to select a suitable phase clock signal from a plurality of clock signals differing in phase from each other in accordance with a clock-selecting signal;
   a phase comparator configured to compare a phase of input data with that of the selected clock signal;
   a phase control circuit configured to generate a phase control signal in accordance with the comparison result obtained by the phase comparator and to generate the clock-selecting signal in accordance with a offset control signal; and
   a frequency offset control circuit configured to generate the offset control signal in accordance with the phase control signal.

18 Claims, 7 Drawing Sheets

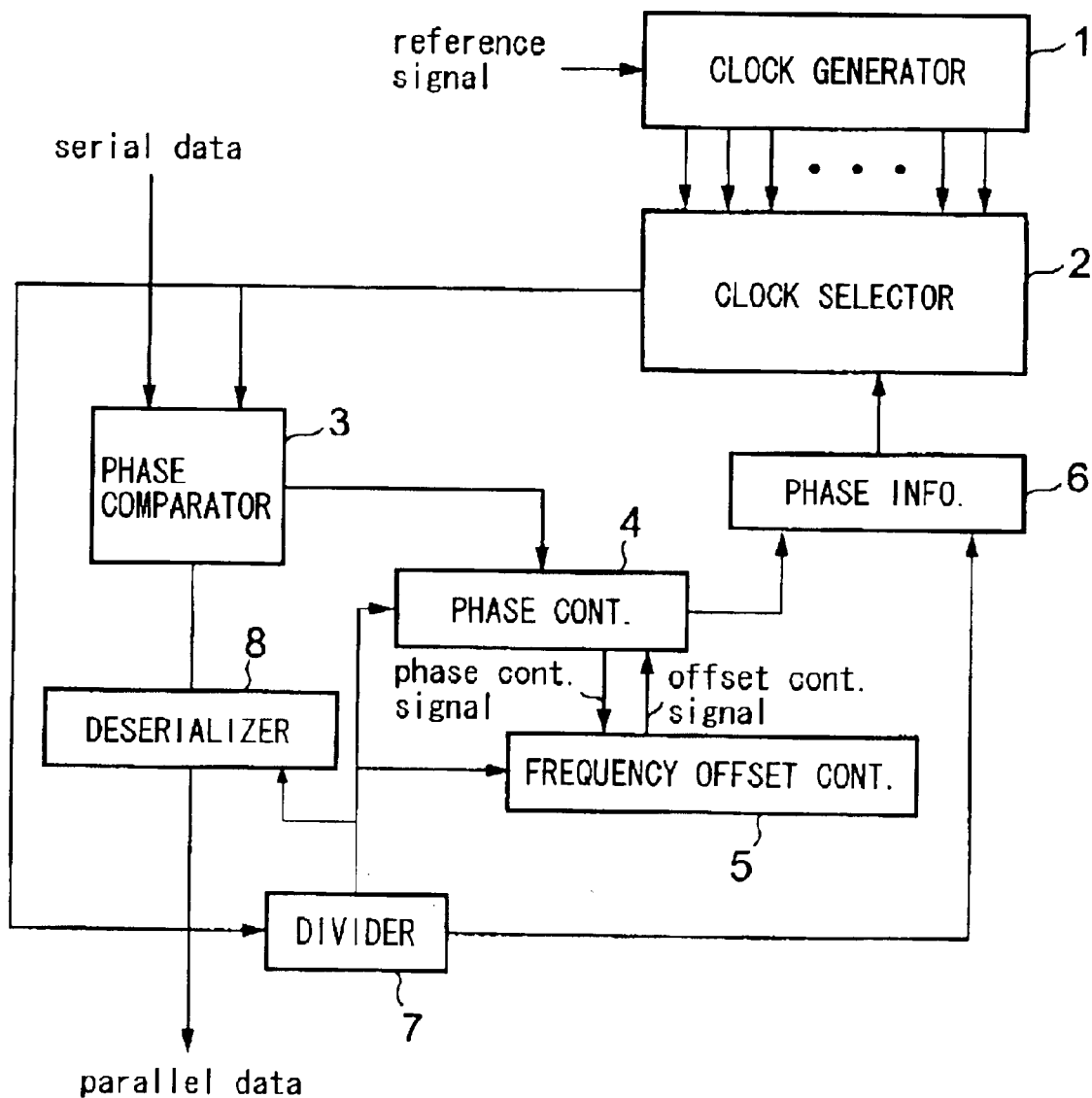
F I G. 1

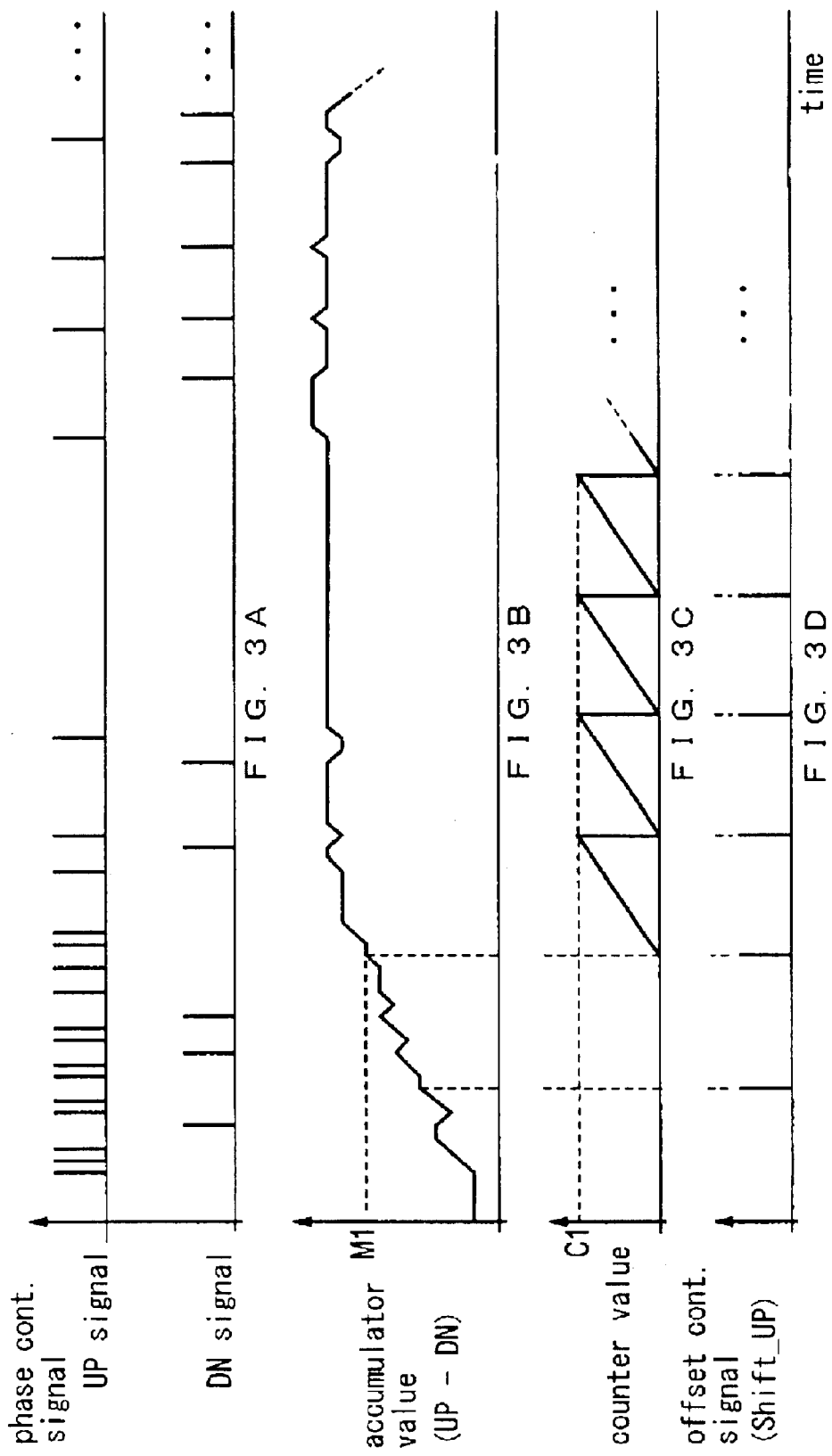

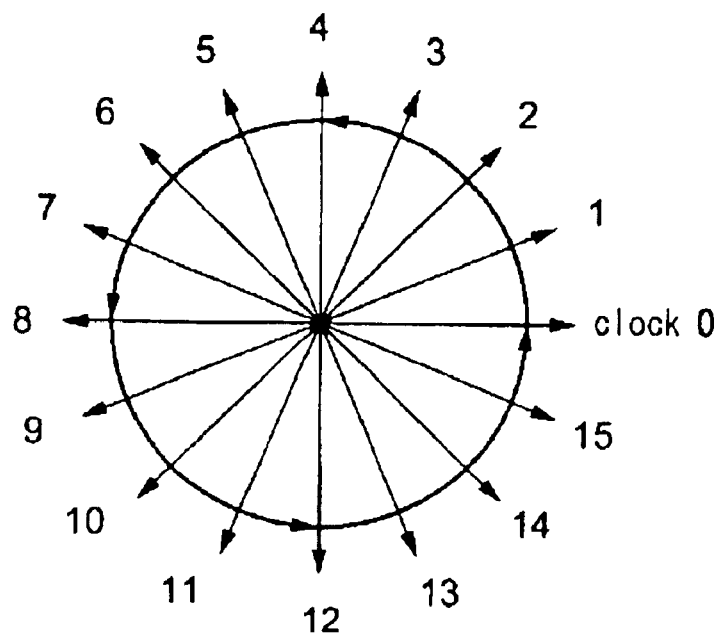
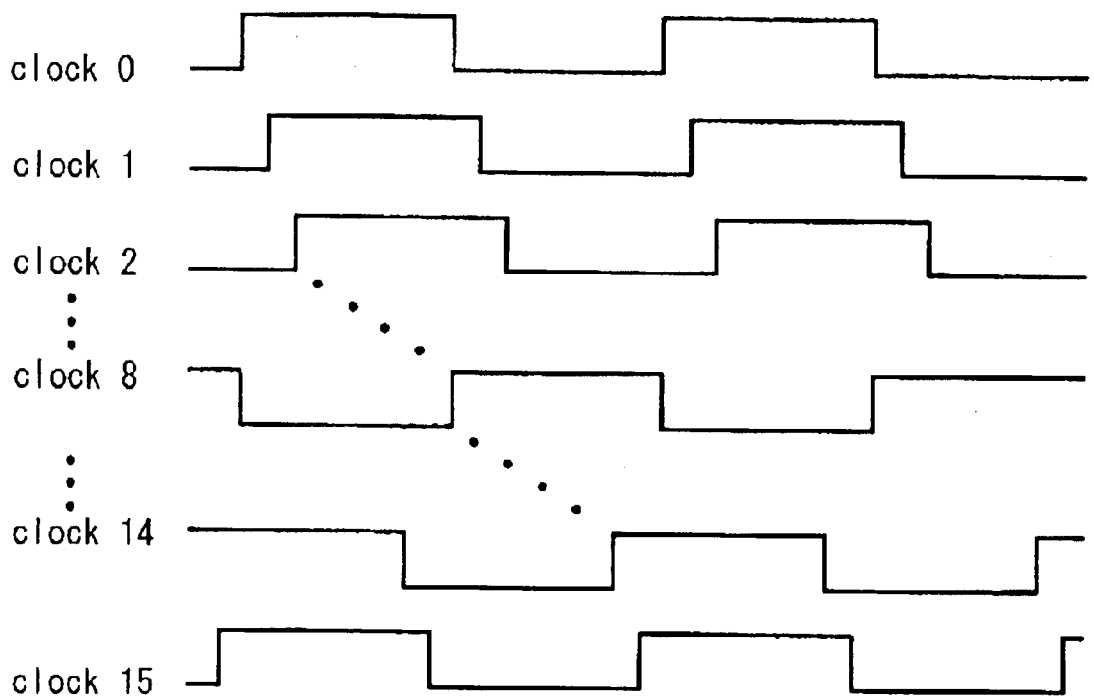
F I G. 4

SYNCHRONOUS CIRCUIT

CROSS-REFERENCE TO RELATED APPLICATIONS

This application is based upon and claims the benefit of priority from prior Japanese Patent Application No. P2002-085117, filed on Mar. 26, 2002; the entire contents of which are incorporated herein by reference.

FIELD OF THE INVENTION

The present invention relates to a synchronous circuit generating a synchronous clock signal by using multi-phases clock signals.

BACKGROUND OF THE INVENTION

FIG. 7 is a block diagram of a synchronous circuit of a phase picking system in the related art of the present invention. The conventional synchronous circuit comprises a clock generator 1, a clock selector 2, a phase comparator 3, a phase control circuit 4, a phase information storage circuit 6, a frequency divider 7 and a deserializer 8.

The clock generator 1 includes a PLL (Phase Locked Loop) or a DLL (Delay Locked Loop) and generates a plurality of clock signals differing in phase from each other, so-called multi-phases clock signals, based on a reference signal. The phase comparator 3 detects a phase difference between received serial data and a clock signal selected by the clock selector 2 and then outputs a phase difference signal.

The phase control circuit 4 controls an edge of the clock signal to so as to be positioned in the center of the data based on the phase difference signal detected by the phase comparator 3. The phase information storage circuit 6 stores a clock-selecting signal outputted from the phase control circuit 4, and the clock selector 2 selects a suitable phase clock signal from the multi-phases clock signals according to the clock-selecting signal in the phase information storage circuit 6. The frequency divider 7, which receives the clock signal selected by the clock selector 2, generates a divided clock signal having lower frequency than the selected clock signal and supplies the divided clock signal to the phase control circuit 4, the phase information storage circuit 6 and the deserializer 8. The deserializer 8 converts a received serial data of a high bit rate, which is synchronized with the selected clock signal, into the parallel data of a low bit rate, which is synchronized with the divided clock signal obtained by the frequency divider 7, and outputting the parallel data.

Specifically, in the conventional synchronous circuit, when there is a data transition of the received serial data, a phase difference between the serial data and the selected clock signal is detected, and a phase error of the selected clock signal is adjusted according to this detection result.

BRIEF SUMMARY OF THE INVENTION

A synchronous circuit according to an embodiment of the present invention, comprising:
  a clock selector configured to select a suitable phase clock signal from a plurality of clock signals differing in phase from each other in accordance with a clock-selecting signal;
  a phase comparator configured to compare a phase of input data with that of the selected clock signal;
  a phase control circuit configured to generate a phase control signal in accordance with the comparison result obtained by the phase comparator and to generate the clock-selecting signal in accordance with a offset control signal; and
  a frequency offset control circuit configured to generate the offset control signal in accordance with the phase control signal.

BRIEF DESCRIPTION OF THE DRAWINGS

A more complete appreciation of embodiments of the present invention and many of its attendant advantages will be readily obtained by reference to the following detailed description considered in connection with the accompanying drawings, in which:

FIG. 1 is a block diagram showing a synchronous circuit according to a first embodiment of the present invention.

FIGS. 3A to 3D are timing charts of a synchronous circuit according to the first embodiment of the present invention.

FIG. 4 is a phase transition view in the case of 16-phases clock signals.

DETAILED DESCRIPTION OF THE EMBODIMENTS

Figure 2A:
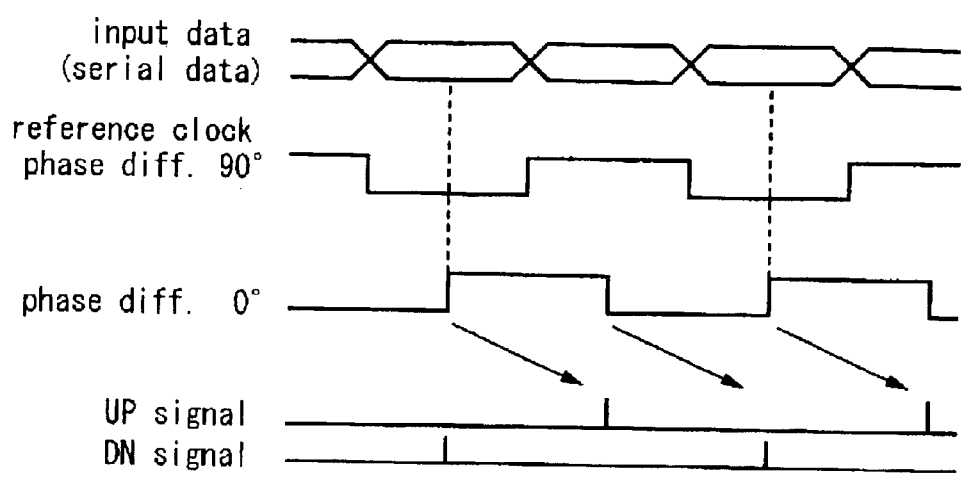
FIGS. 2A to 2C are timing charts of a phase control circuit in the synchronous circuit of the first embodiment of the present invention.

As a transmission speed of serial data to be received is increased, there arises a need to increase the number of multi-phases clock signals generated and to increase resolution thereof. However, the increase of the resolution which means to reduce a gain of a compensation of the phase difference due to switching of a selected clock signal, that is, to reduce a loop gain. Particularly, in a system that tolerates inexistence of data transitions, tracking for a frequency offset becomes difficult to perform.

For example, when there is a frequency offset of 200 ppm (0.02%) in 16-phases clock signals, the number of cycles generating phase errors corresponding to the phase difference ($2\pi/16$) between a clock signal and a clock signal next thereto is obtained in the following equation:

$$(1/16) \div 0.02\% = 1 \div (16 \times 0.0002) = 312.5$$

Meanwhile, when a resolution is increased to be 64-phases clock signals, the number of cycles is obtained in the following equation:

$$(1/64) \div 0.02\% = 1 \div (64 \times 0.0002) = 78.125$$

To be specific, unless a negative feedback control is performed in a period corresponding to these cycles, the phase errors corresponding to the phase difference up to the next clock signal are generated. In other words, when there is no transition of data, no feedback is performed, thus making it impossible to perform the tracking by the synchronous circuit.

Consequently, it is an object of an embodiment of the present invention to automatically perform switching of clock signals in the clock selector by detecting the frequency offset, even a period without transition of data.

With reference to the drawings, embodiments of the present invention will be described below.

First Embodiment

FIG. 1 is a block diagram of a synchronous circuit according to a first embodiment of the present invention, the synchronous circuit serves as a receiver that receives serial data and outputs the data as parallel data. The synchronous circuit of this embodiment comprises: a clock generator 1 for generating multi-phases clock signals based on a reference signal; a clock selector 2 for selecting a clock signal from the multi-phases clock signals and outputting the selected clock signal; a phase comparator 3 for comparing a phase of received serial data to that of the selected clock signal and outputting the serial data synchronized with the selected clock signal; a phase control circuit 4 for controlling a clock signal to be selected in such a manner that an edge (rise/fall) of the selected clock signal is positioned in the center of the input data; a frequency offset control circuit 5 for outputting an offset control signal according to a phase control signal from the phase control circuit 4; a phase information storage circuit 6 for storing a clock-selecting signal outputted by the phase control circuit 4 and controlling the clock selector 2; a frequency divider 7 for dividing a frequency of the selected clock signal; and a deserializer 8 for converting the serial data of a high bit rate, which is synchronized with the selected clock signal, into the parallel data of a low bit rate, which is synchronized with a clock signal obtained by dividing the selected clock signal, and outputting the parallel data.

The clock generator 1 includes, for example, a PLL (Phase Locked Loop) or a DLL (Delay Locked Loop). The clock generator 1 generates a plurality of clock signals differing in phase from each other, so-called multi-phases clock signals, based on a reference signal. The clock selector 2 selects a clock signal from the multi-phases clock signals and outputting the selected clock signal. The phase comparator 3 compares a phase of received serial data with that of the selected clock signal and detects a phase difference between the received serial data and the selected clock signal, and then outputs the phase difference signal to the phase control circuit 4. Also, the phase comparator 3 outputs the serial data to the deserializer 8.

Figure 2B:
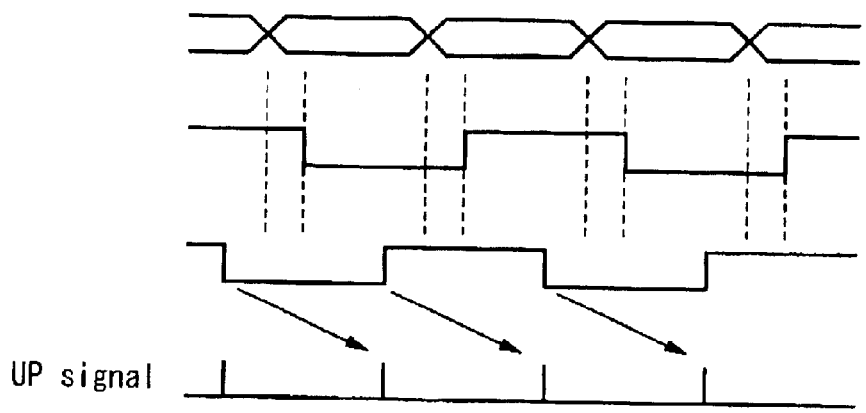
Figure 2C:
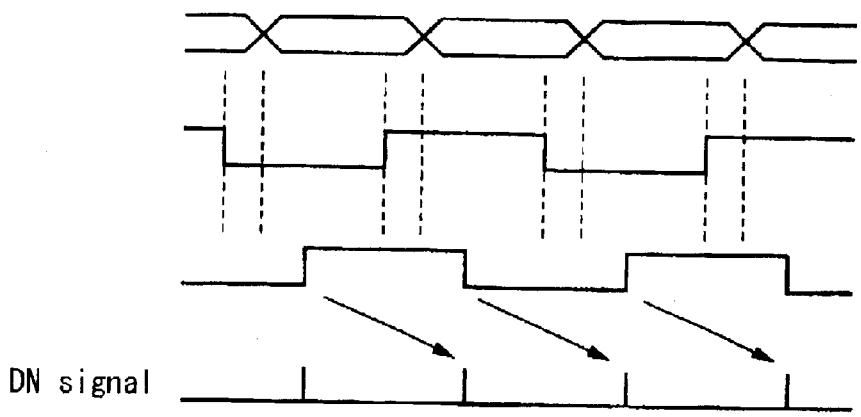

The phase control circuit 4 outputs the phase control signal (UP signal/DN signal) in accordance with the comparison result in the phase comparator 3. The UP signal and the DN signal are supplied to the frequency offset control circuit 5. Here, output conditions of the UP signal and the DN signal will be described by use of comparison clock signals of two systems having 0° and 90° phase differences with respect to the selected clock signal. FIGS. 2A to 2C are timing charts of the UP signal or the DN signal outputted by the phase control circuit 4. When the phases coincide with each other, the UP signal or the DN signal is outputted according to the serial data transition (FIG. 2A). The state where the UP and DN signals are outputted with equal frequency almost like alternately represents that the phases coincide with each other.

Moreover, when an edge (rise/fall) of the comparison clock signal having 90° phase difference is positioned to the right of a boundary of input data, that is, when timing of the comparison clock signal is delayed, the UP signal is outputted (FIG. 2B). Meanwhile, when the edge (rise/fall) of the comparison clock signal is positioned to the left of the boundary of the input data, that is, when the timing of the comparison clock signal is advancing, the DN signal is outputted (FIG. 2C). When the comparison is not performed in the phase comparator 3, that is, when there is no transition of the input data, neither of the UP and DN signals are outputted.

The frequency offset control circuit 5 outputs the offset control signal (Shift_UP signal or Shift_DN signal) based on the UP and DN signals from the phase control circuit 4. The offset control signal is supplied to the phase control circuit 4. The frequency offset control circuit 5 of this embodiment includes, for example, an accumulator and a counter. The accumulator accumulates the UP and DN signals. The counter, which counts synchronizing with the divided clock signal obtained by the frequency divider 7, serves as a clock for forcibly outputting the offset control signal.

When the absolute value of a cumulative number of the UP and DN signals (UP signal-DN signal) is less than an activation threshold value M1, the offset control signal is outputted according to this cumulative number. For example, when the cumulative number of the UP and DN signals comes to be a desired number, the offset control signal is outputted. As to the offset control signal, the Shift_UP signal is outputted when the cumulative number increases in the positive direction, and the Shift_DN signal is outputted when the cumulative number increases in the negative direction. For example, as the cumulative number increases in the positive direction and comes to be a predetermined number, the Shift_UP signal is outputted. Thereafter, if the cumulative number continues to increase in the positive direction and comes to be the predetermined number again, the Shift_UP signal is outputted. On the other hand, if the cumulative number changes in the negative direction thereafter and comes to be the predetermined number, the Shift_DN signal is outputted.

Meanwhile, when the cumulative number comes to be equal to or more than the activation threshold value M1 of the counter, the offset control signal is forcibly outputted based on the counter. For example, the counter stops its operation when the absolute value of the cumulative number (UP signal-DN signal) in the accumulator is less than the activation threshold value M1 and starts its operation when the absolute value reaches the activation threshold value M1. Then, when the counter outputs carry, that is, when a count value comes to a counter reset threshold value C1, the frequency offset control circuit 5 forcibly outputs the offset control signal.

When the offset control signal is outputted, the counter is reset and starts counting up again from 0. Then, when the count value comes to the counter reset threshold value C1 again, the frequency offset control circuit 5 outputs the offset control signal. The counter repeats the above-described operation until the cumulative number comes to be equal to or less than a stop threshold value M2. The stop threshold value M2 is set to a value that achieves $M2 \leq M1$.

In response to the offset control signal from the frequency offset control circuit 5, the phase control circuit 4 further outputs the clock-selecting signal to the phase information storage circuit 6. The phase information storage circuit 6 stores the clock-selecting signal from the phase control circuit 4. The clock-selecting signal stored in the phase information storage circuit 6 is outputted, for controlling the clock selector 2, based on a timing of the divided clock signal obtained by the frequency divider 7. Based on the clock-selecting signal from the phase information storage circuit 6, the clock selector 2 newly selects a clock signal having a minimum phase difference, which is most adjacent to the current selected clock signal.

Next, the operation in this embodiment will be described by use of FIGS. 3A to 3D. The multi-phases clock signals generated in the clock generator 1 are set to 16-phases clock signals, and a case where the UP and DN signals are outputted from the phase control circuit 4 as shown in FIG. 3A is considered. FIG. 4 shows a phase transition in the case of the 16-phases clock signals. In this event, a phase difference between clock signals adjacent to each other is $2\pi/16$ (a cycle time÷16). It is assumed that clock signal 0 is selected first in the clock selector 2.

In FIG. 3A, more UP signals are outputted than the DN signals. Specifically, the output of more UP signals indicates that the timing of the selected clock signal is delayed with respect to the input data. When there is a transition of the input data, the UP and DN signals are outputted from the phase control circuit 4. The UP and DN signals outputted from the phase control circuit 4 are accumulated by the accumulator in the frequency offset control circuit 5. FIG. 3B is a graph showing a transition of the cumulative number in the accumulator.

When the absolute value of the cumulative number (UP signal-DN signal) is less than the activation threshold value M1 and the cumulative number becomes a predetermined number, the frequency offset control circuit 5 outputs the Shift_UP signal. In FIG. 3, the Shift_UP signal is outputted when the cumulative number becomes multiple number of four (the multiple number 4 is, for example, the predetermined number).

The outputted Shift_UP signal is outputted to the phase control circuit 4. When receiving the Shift_UP signal, the phase control circuit 4 rewrites the clock-selecting signal in the phase information storage circuit 6. The phase information storage circuit 6 controls the clock selector 2 according to the rewritten clock-selecting signal. Then, based on the clock-selecting signal stored in the phase information storage circuit 6, the clock selector 2 newly selects a clock signal having a phase difference of $-2\pi/16$ with respect to the selected clock signal.

When the first Shift_up signal is outputted, the clock-selecting signal in the phase information storage circuit 6 is rewritten. Then, in the clock selector 2, a clock signal having a phase difference of $-2\pi/16$ with respect to clock signal 0, that is, clock signal 15 (="clock signal 0"$-2\pi/16$) is selected. Similarly, when the second Shift_UP signal is outputted, clock signal 14 having a phase difference of $-2\pi/16$ with respect to clock signal 15 is selected.

Moreover, when the cumulative number reaches the activation threshold value M1, the counter in the frequency offset control circuit 5 starts its operation (FIG. 3C). When the counter reaches the counter reset threshold value C1, the frequency offset control circuit 5 forcibly outputs the Shift_UP signal (FIG. 3D).

When the Shift_UP signal is forcibly outputted, the counter is reset and starts the operation again from 0. Then, if the counter reaches the counter reset threshold value C1 again, the frequency offset control circuit 5 forcibly outputs the Shift_UP signal. Subsequently, based on the operation of the counter, the frequency offset control circuit 5 repeats the operation of forcibly outputting the Shift_UP signal. Then, every time the Shift_UP signal is outputted, a new clock signal is selected.

In FIG. 3D, after the second Shift_UP signal is outputted in response to the cumulative number, the number of the outputs of the UP and DN signals decreases and does not reach the predetermined number (the multiple number of four). However, the Shift_UP signal is outputted. This is because the offset control signal is outputted based on the counter, even if there is no transition of the input data, that is, no UP and DN signals are outputted. Specifically, after the counter starts the operation, the offset control signal is outputted in response to the operation of the counter, regardless of the cumulative number.

The counter stops when the cumulative number comes to be less than the stop threshold value M2 (M2$\leq$M1), that is, when the difference between the UP and DN signals becomes sufficiently small. In this case, the phase difference never increases, and thus no offset control signal has to be forcibly outputted.

The case of outputting the Shift_UP signal was described above. However, when more DN signals are outputted than the UP signals, the timing of the selected clock signal is advancing than the input data and thus the Shift_DN signal is outputted in order to select a clock signal having a delayed phase. Then, when the Shift_DN signal is outputted, the clock selector 2 newly selects a clock signal having a phase difference of $+2\pi/16$ with respect to the selected clock signal.

According to the first embodiment, even when there is no data transition and no phase comparison between the input data and the selected clock signal is made by the phase comparator 3, the frequency offset control circuit 5 forcibly outputs the offset control signal. Thus, the phase errors caused by the frequency offset can be compensated and the clock signal synchronized with the input data can be automatically selected.

Second Embodiment

A feature of a synchronous circuit according to a second embodiment of the present invention is to change a threshold value at which the carry (or the borrow) of the counter in the frequency offset control circuit is outputted based on the outputted UP and DN signals.

A constitution of the synchronous circuit according to the second embodiment is similar to that shown in FIG. 1 described in the first embodiment. Moreover, constituent components other than the frequency offset control circuit 5 can be similar to those in the first embodiment, and thus description thereof will be omitted.

The frequency offset control circuit 5 outputs an offset control signal (Shift_UP signal or Shift_DN signal) based on UP and DN signals from the phase control circuit 4. The frequency offset control circuit 5 in this embodiment also includes, for example, an accumulator and a counter. A threshold value of the counter in this embodiment is assumed to be variable.

When the absolute value of a cumulative number (UP signal-DN signal) of the UP and DN signals is less than an activation threshold value M1, the offset control signal is outputted in accordance with this cumulative number. Meanwhile, when the cumulative number comes to be equal to or more than the activation threshold value M1, the offset control signal is outputted based on the counter.

For example, the counter stops its operation when the cumulative number is less than the activation threshold value M1 and starts the operation when the cumulative number exceeds the activation threshold value M1. Then, when the counter starts to operate and exceeds a counter reset threshold value C1, the frequency offset control circuit 5 forcibly outputs the offset control signal. When the offset control signal is outputted, the counter is reset. Furthermore, the counter changes a threshold value for outputting the next offset control signal and starts counting up again from 0. Assuming a counter reset threshold value after the change to be C2, when the counter exceeds this threshold value C2, the frequency offset control circuit 5 outputs the offset control signal.

The threshold value of the counter is changed in accordance with output frequencies of the UP and DN signals, that is, a speed of increasing the cumulative number.

Here, considered is a case where the Shift_UP signal is outputted as the offset control signal. For example, if the output frequency of the UP signals is higher than that of the DN signals, the frequency offset is increased fast. Therefore, since timing of outputting the next offset control signal is desired to be early, the counter reset threshold value is set less than C1. On the other hand, if there is no significant difference between the output frequencies of the DN and UP signals, the frequency offset is increased slowly. Therefore, the timing of outputting the offset control signal is delayed by use of the timing as it is (the counter reset threshold value C1) or by increasing the counter reset threshold value more than C1.

Moreover, in the case of outputting the Shift_DN signal as the offset control signal, if the output frequency of the DN signals is higher than that of the UP signals, the counter reset threshold value is set less than C1. On the other hand, if there is no significant difference between the output frequencies of the DN and UP signals, the counter reset threshold value is not changed.

Next, the operation of the frequency offset control circuit 5 in this embodiment will be described by use of FIGS. 5A to 5D. Considered is a case where the UP and DN signals are outputted from the phase control circuit 4 as shown in FIG. 5A.

The frequency offset control circuit 5 outputs the Shift_UP signal when the absolute value of the cumulative number (UP signal-DN signal) is less than the activation-threshold value M1 and the cumulative number becomes a predetermined number.

Figure 5:
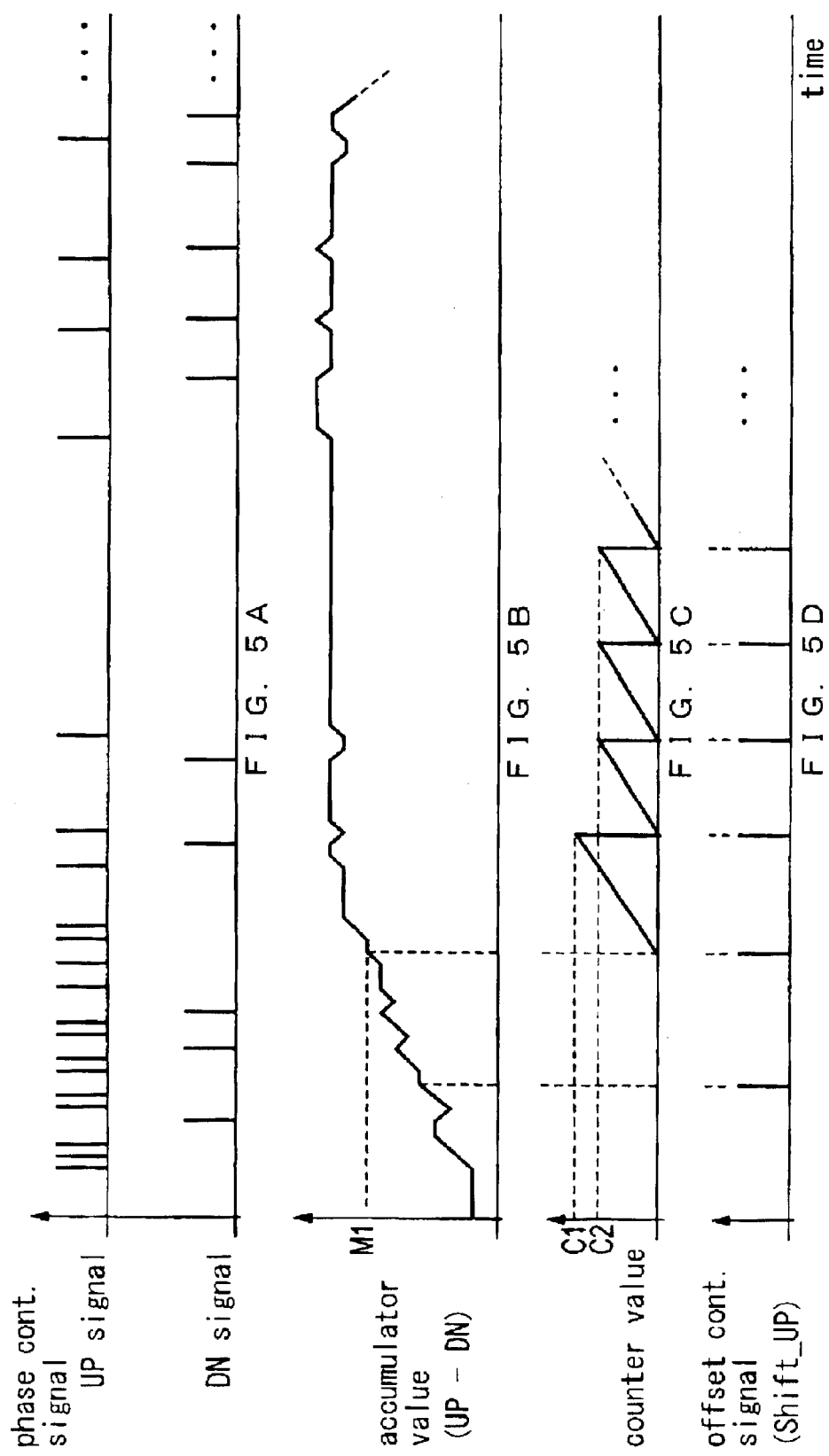
FIGS. 5A to 5D are timing charts of a synchronous circuit according to a second embodiment of the present invention.

Moreover, when the cumulative number reaches the activation threshold value M1, the counter in the frequency offset control circuit 5 starts to operate. In FIG. 5, the counter starts to operate after the second Shift_UP signal is outputted. Then, when the counter reaches the counter reset threshold value C1, the frequency offset control circuit 5 forcibly outputs the third Shift_UP signal.

When the Shift_UP signal is outputted, the counter is reset and the threshold value is changed from C1 to C2. In FIG. 5A, the output frequency of the UP signals is higher than that of the DN signals, and thus the counter reset threshold value C2 has a value less than C1. Alternatively, if the output frequency of the UP signals is lower than that of the DN signals, C2=C1 is set as it is.

Then, when the counter reaches the counter reset threshold value C2 the frequency offset control circuit 5 forcibly outputs the Shift_UP signal. When the Shift_UP signal is outputted, the counter is reset and the threshold value is changed from C2 to C3. The threshold value C3 is set to a less value than C2 if the output frequency of the UP signals is higher than that of the DN signals and is set to C1 if lower.

Subsequently, a similar operation to the above-described operation is repeated by use of counter reset threshold values Cn (n=3, 4, . . . ), and the Shift_UP signal is outputted every time the counter value reaches the counter reset threshold value Cn. The counter continues to operate until the cumulative number becomes the stop threshold value M2 (M2≦M1).

When UP signal—DN signal<0, the Shift_DN signal is outputted, and the above-described operation can be considered similarly by reversing the relationship between the UP and DN signals in the foregoing description.

According to the second embodiment, even when there is no data transition and no phase comparison between the input data and the selected clock signal is made by the phase comparator 3, the frequency offset control circuit 5 forcibly outputs the offset control signal. Thus, the phase errors caused by the frequency offset can be compensated and the clock signal synchronized with the input data can be automatically selected.

Moreover, in the frequency offset control circuit 5 according to the second embodiment, the threshold value of the counter is changed in accordance with the spread of the phase errors, that is, the phase comparison result when there is the data transition. Thus, the timing of outputting the offset control signal can be changed, and the tracking can be performed in response to the speed of spreading phase errors caused by the frequency offset.

Third Embodiment

A feature of a synchronous circuit according to a third embodiment of the present invention is to change a gain of a counter in a frequency offset control circuit, based on outputted UP and DN signals.

A constitution of the synchronous circuit according to the third embodiment is similar to that shown in FIG. 1 described in the first embodiment. Moreover, constituent components other than the frequency offset control circuit 5 can be similar to those in the first embodiment, and thus description thereof will be omitted.

The frequency offset control circuit 5 outputs an offset control signal (Shift_UP signal or Shift_DN signal) based on UP and DN signals from the phase control circuit 4. The frequency offset control circuit 5 in this embodiment also includes, for example, an accumulator and a counter. A gain of the counter according to this embodiment is variable. A threshold value of the counter is assumed to be fixed.

When the absolute value of a cumulative number (UP signal-DN signal) of the UP and DN signals is smaller than an activation threshold value M1, the offset control signal is outputted in accordance with this cumulative number. Meanwhile, when the cumulative number comes to be equal to or more than the activation threshold value M1, the offset control signal is outputted based on the counter.

For example, the counter stops its operation when the cumulative number is less than the activation threshold value M1 and starts the operation when the cumulative number exceeds the activation threshold value M1. Then, when the counter starts to operate and a count value comes to be equal or more than the counter reset threshold value C1, the frequency offset control circuit 5 forcibly outputs the offset control signal. When the offset control signal is outputted, the counter is reset. Furthermore, the counter changes a gain according to the cumulative number and starts counting up again from 0. Then, when the count value comes to be equal or more than the counter reset threshold value C1 again, the frequency offset control circuit 5 outputs the offset control signal.

The gain of the counter changes its value in accordance with output frequencies of the UP and DN signals, that is, a speed at which the cumulative number increases or decreases.

Here, considered is a case where the Shift_UP signal is outputted as the offset control signal. For example, if the output frequency of the UP signals is higher than that of the DN signals, the frequency offset is considered to increase fast. Therefore, since timing of outputting the next offset control signal is desired to be early, the gain of the counter is increased. For example, the counter counts up by +1 in its initial state, however, if the output frequency of the UP signals is high, the gain is increased by counting up by +2.

On the other hand, if there is no significant difference between the output frequencies of the DN and UP signals, the frequency offset is increased slowly. Therefore, the timing of outputting the offset control signal is delayed by use of the timing as it is or by reducing the gain. For example, the output frequency of the DN signals is low, the gain is reduced by counting up by +1 in place of +2.

Moreover, in the case of outputting the Shift_DN signal as the offset control signal, if the output frequency of the DN signals is higher than that of the UP signals, the gain of the counter is increased. On the other hand, if there is no significant difference between the output frequencies of the DN and UP signals, the gain is not changed. Alternatively, if the output frequency of the DN signals becomes high, the gain is reduced.

Next, the operation of the frequency offset control circuit 5 according to this embodiment will be described by use of FIGS. 6A to 6D. Considered is a case where the UP and DN signals are outputted from the phase control circuit 4 as shown in FIG. 6A.

The frequency offset control circuit 5 outputs the Shift_UP signal when the absolute value of the cumulative number (UP signal-DN signal) is less than the activation threshold value M1 and the cumulative number becomes a predetermined number.

Moreover, when the cumulative number reaches the activation threshold value M1, the counter in the frequency offset control circuit 5 starts to operate. When a count value comes to be equal or more than the counter reset threshold value C1, the frequency offset control circuit 5 forcibly outputs the Shift_UP signal.

Figure 6:
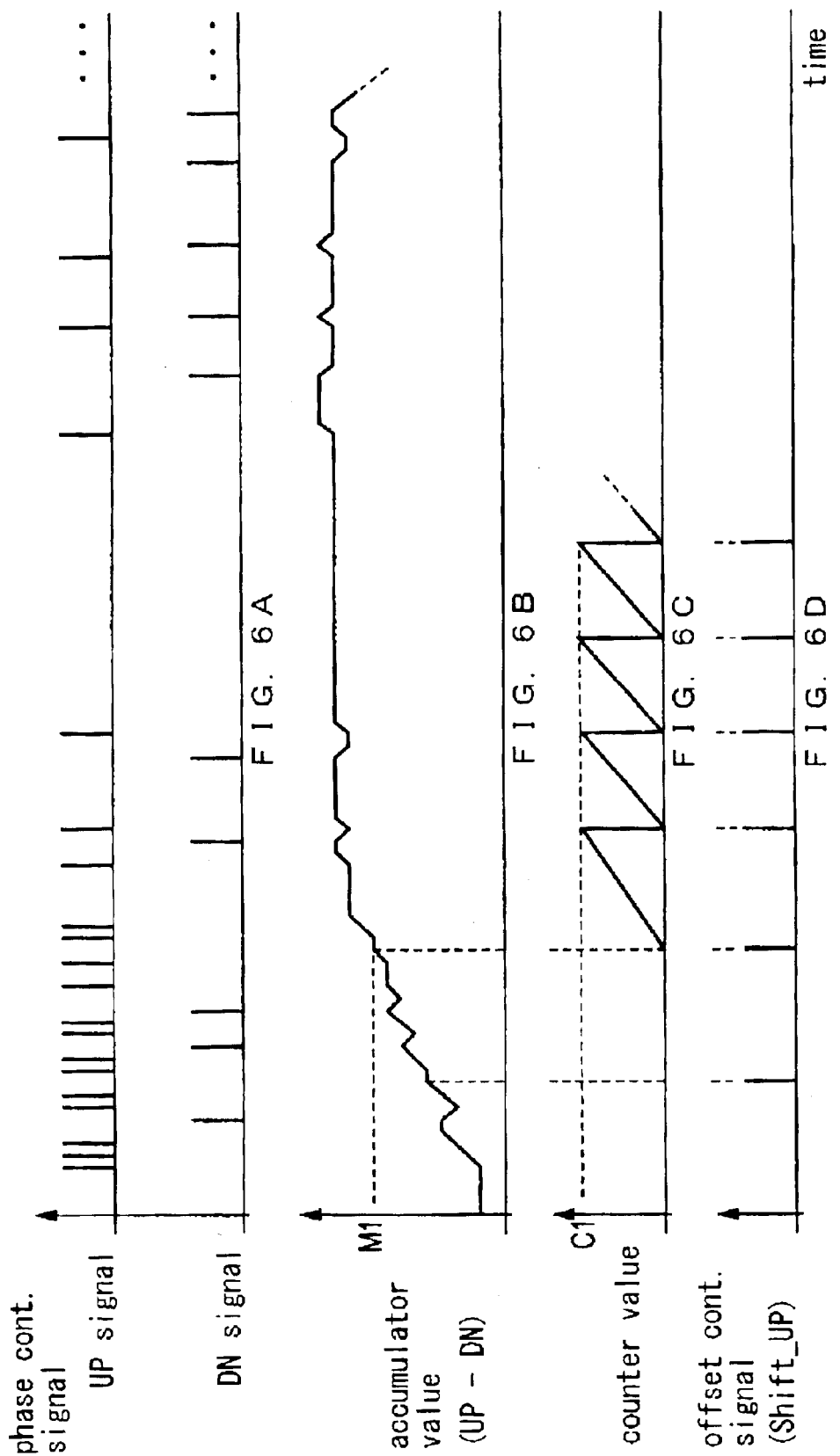
FIGS. 6A to 6D are timing charts of a synchronous circuit according to a third embodiment of the present invention.
Figure 7:
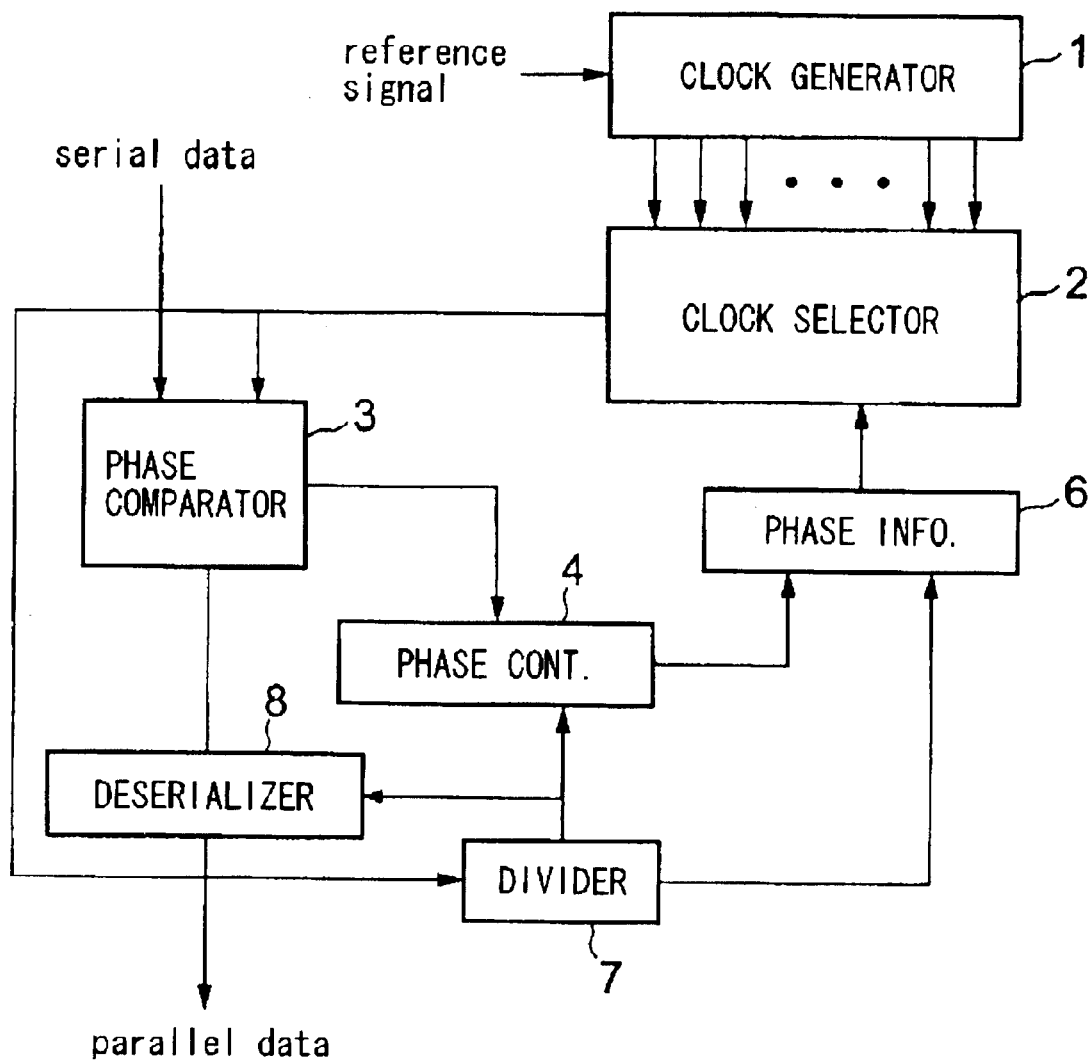
FIG. 7 is a block diagram showing a synchronous circuit according to a conventional art.

When the Shift_UP signal is forcibly outputted, the counter is reset and the gain is changed. In FIG. 6, the output frequency of the UP signals is sufficiently higher than that of the DN signals, and thus the gain is increased. Then, when the count value comes to be equal or more than the counter reset threshold value C1 again, the frequency offset control circuit 5 forcibly outputs the Shift_UP signal. Subsequently, the counter adjusts the gain by comparing the output frequencies of the UP and DN signals and outputs the Shift_UP signal every time the count value comes to be equal or more than the counter reset threshold value C1. The counter continues to operate until the cumulative number becomes a stop threshold value M2 (M2≦M1).

According to the third embodiment, even when there is no data transition and no phase comparison between the input data and the selected clock signal is made by the phase comparator, the frequency offset control circuit 5 forcibly outputs the offset control signal. Thus, the phase errors caused by the frequency offset can be compensated and the clock signal synchronized with the input data can be automatically selected.

Moreover, in the frequency offset control circuit 5 according to the third embodiment, the gain of the counter is changed in accordance with the spread of the phase errors, that is, the phase comparison result when there is the data transition. Thus, the timing of outputting the offset control signal can be changed, and the tracking can be performed in response to the speed of spreading phase errors caused by the frequency offset.

The foregoing embodiments are all examples, and not limited to the present invention. For example, although the foregoing embodiments explained the clock selector of the phase picking system, it is displaceable to a clock selector of a phase interpolator system. In the clock selector of the phase interpolator, the clock selector selects two clock signals adjacent to each other from the M-phases clock signals (M≧4) generated by the clock generator, and the M-phases clock signals have an approximately same phase difference between the clocks adjacent to each other. Then, the clock selector newly selects a clock signal from L-phases clock signals (L≧2), and outputs the newly selected clock signal to the phase comparator. The L-phases clock signals are obtained by dividing the phase difference between the two clock signals selected from the M-phases clock signals, and the L-phases clock signals have an approximately same phase difference between the clocks adjacent to each other. Therefore, the clock selector of the phase interpolator system has an almost same function as that of the clock selector of the N-phases picking system (N=M×L), which selects a clock signal from the N-phases clock signals having an approximately same phase difference between the clocks adjacent to each other.

While there has been illustrated and described embodiments of the present invention, it will be understood by those skilled in the art that various change and modifications may be made, and equivalents may be substituted for devices thereof without departing from the true scope of the invention. In addition, many modifications may be made to adapt a particular situation or material to the teaching of the present invention without departing from the central scope thereof. Therefore, it is intended that this invention not be limited to the particular embodiment disclosed, but that invention include all embodiments falling the scope of the appended claims.

What is claimed is:

1. A synchronous circuit, comprising:
   a clock selector configured to select a suitable phase clock signal from a plurality of clock signals differing in phase from each other in accordance with a clock-selecting signal;
   a phase comparator configured to compare a phase of input data with that of the selected clock signal;
   a phase control circuit configured to generate a phase control signal in accordance with the comparison result obtained by the phase comparator and to generate the clock-selecting signal in accordance with a offset control signal; and
   a frequency offset control circuit configured to generate the offset control signal in accordance with the phase control signal.

2. The synchronous circuit according to claim 1, wherein the phase control signal includes a first phase control signal to be generated when the phase of the selected clock signal is delaying than the phase of the input data and a second phase control signal to be generated when the phase of the selected clock signal is advancing than the phase of the input data.

3. The synchronous circuit according to claim 2, wherein the frequency offset control circuit generates the offset control signal in accordance with a value of difference of the number of times which the first phase control signal generated and the number of the times which the second phase control signal generated when the value of the difference is less than a first threshold value.

4. The synchronous circuit according to claim 3, wherein the frequency offset control circuit further generates the offset control signal at predetermined intervals when the value of the difference exceeds the first threshold value.

5. The synchronous circuit according to claim 4, wherein the frequency offset control circuit generates the offset control signal in accordance with only the value of the difference when the value of the difference becomes equal to or less than a second threshold value after the value of the difference exceeds the first threshold value.

6. The synchronous circuit according to claim 5, wherein the second threshold value is equal to or less than the first threshold value.

7. The synchronous circuit according to claim 1, further comprising a clock generator configured to generate the plurality of clock signals differing in phase from each other.

8. The synchronous circuit according to claim 1, further comprising a phase information storage circuit configured to store the clock-selecting signal and to supply the clock-selecting signal to the clock selector.

9. The synchronous circuit according to claim 8, further comprising a frequency divider configured to divide the selected clock signal,
wherein the phase control circuit, the frequency offset control circuit and the phase information storage circuit operate each other synchronizing with the timing of the divided clock signal.

10. The synchronous circuit according to claim 1, further comprising a deserializer configured to convert the input data into the parallel data.

11. The synchronous circuit according to claim 4, the frequency offset control circuit further comprising:
an accumulator configured to accumulate a value of difference of the number of times which the first phase control signal generated and the number of the times which the second phase control signal generated; and
a counter configured to start an operation thereof when the value of the difference exceeds the first threshold value;
wherein the frequency offset control circuit generates the offset control signal in accordance with the value of the accumulator and the counter.

12. The synchronous circuit according to claim 11, wherein the counter changes a counter reset threshold value in accordance with the frequencies that each of the first and second phase control signal generated.

13. The synchronous circuit according to claim 11, wherein the counter changes a gain of counting in accordance with the frequencies that each of the first and second phase control signal generated.

14. The synchronous circuit according to claim 11, wherein the counter starts an operation thereof when the value of the difference exceeds the first threshold value, and subsequently stops operation thereof when the value of the difference becomes equal to the second threshold value.

15. The synchronous circuit according to claim 2, wherein the frequency offset controller generates the offset control signal to select a clock signal of which phase is advancing than that of the selected clock signal when the frequency which the first phase control signal generated is higher than the frequency which the second phase control signal generated.

16. The synchronous circuit according to claim 2, wherein the frequency offset controller generates the offset control signal to select a clock signal of which phase is delaying than that of the selected clock signal when the frequency which the first phase control signal generated is lower than the frequency which the second phase control signal generated.

17. The synchronous circuit according to claim 1, wherein the clock selector selects a clock signal from M-phases clock signals in accordance with the clock-selecting signal, the M-phases clock signals have an approximately same phase difference between the clock signals adjacent to each other.

18. The synchronous circuit according to claim 1, wherein the clock selector selects a clock signal from L-phases clock signals in accordance with the clock-selecting signal, the L-phases clock signals are obtained by dividing the phase difference between two clock signals adjacent to each other which selected from M-phases clock signals having an approximately same phase difference between the clock signals adjacent to each other.

* * * * *